US008482111B2

(12) United States Patent  
Haba

(10) Patent No.: US 8,482,111 B2  
(45) Date of Patent: Jul. 9, 2013

(54) STACKABLE MOLDED MICROELECTRONIC PACKAGES

(75) Inventor: Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 224 days.

(21) Appl. No.: 12/838,974

(22) Filed: Jul. 19, 2010

(65) Prior Publication Data

US 2012/0013000 A1    Jan. 19, 2012

(51) Int. Cl.
H01L 23/31 (2006.01)
H01L 23/498 (2006.01)
H01L 21/56 (2006.01)
H01L 25/10 (2006.01)

(52) U.S. Cl.
USPC ............ 257/686; 257/737; 257/E25.006; 257/691; 257/692; 257/700; 438/112

(58) Field of Classification Search
USPC ............ 257/686, 737, E25.006; 438/112
See application file for complete search history.

(56) References Cited

U.S. PATENT DOCUMENTS

| | | |
|---|---|---|
| 3,358,897 A | 12/1967 | Christensen |
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |

(Continued)

FOREIGN PATENT DOCUMENTS

| | | |
|---|---|---|
| EP | 920058 | 6/1999 |
| EP | 2234158 A1 | 9/2010 |

(Continued)

OTHER PUBLICATIONS

Bang, U.S. Appl. No. 10/656,534, filed Sep. 5, 2003.

(Continued)

Primary Examiner — Olik Chaudhuri
Assistant Examiner — Nicholas Tobergte
(74) Attorney, Agent, or Firm — Lerner, David, Littenberg, Krumholz & Mentlik, LLP

(57) ABSTRACT

A microelectronic package has a microelectronic element overlying or mounted to a first surface of a substrate and substantially rigid conductive posts projecting above the first surface or projecting above a second surface of the substrate remote therefrom. Conductive elements exposed at a surface of the substrate opposite the surface above which the conductive posts project are electrically interconnected with the microelectronic element. An encapsulant overlies at least a portion of the microelectronic element and the surface of the substrate above which the conductive posts project, the encapsulant having a recess or a plurality of openings each permitting at least one electrical connection to be made to at least one conductive post. At least some conductive posts are electrically insulated from one another and adapted to simultaneously carry different electric potentials. In particular embodiments, the openings in the encapsulant at least partially expose conductive masses joined to posts, fully expose top surfaces of posts and partially expose edge surfaces of posts, or may only partially expose top surfaces of posts.

15 Claims, 9 Drawing Sheets

U.S. PATENT DOCUMENTS

| | | |
|---|---|---|
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,083,697 A | 1/1992 | Difrancesco |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A | 11/1996 | Nishimura et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,495,914 B1 | 12/2002 | Sekine et al. |
| 6,507,104 B2 | 1/2003 | Ho et al. |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,762,078 B2 | 7/2004 | Shin et al. |
| 6,765,287 B1 | 7/2004 | Lin |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,987,032 B1 | 1/2006 | Fan et al. |
| 7,045,884 B2 | 5/2006 | Standing |
| 7,061,079 B2 | 6/2006 | Weng et al. |
| 7,067,911 B1 | 6/2006 | Lin et al. |
| 7,119,427 B2 | 10/2006 | Kim |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,262,124 B2 | 8/2007 | Fujisawa |
| 7,323,767 B2 | 1/2008 | James et al. |
| 7,365,416 B2 * | 4/2008 | Kawabata et al. ............ 257/686 |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |

| Patent/Publication | Kind | Date | Inventor(s) | Ref |
|---|---|---|---|---|
| 7,476,962 | B2 | 1/2009 | Kim | |
| 7,485,562 | B2 | 2/2009 | Chua et al. | |
| 7,495,342 | B2 | 2/2009 | Beaman et al. | |
| 7,517,733 | B2 | 4/2009 | Camacho et al. | |
| 7,538,565 | B1 | 5/2009 | Beaman et al. | |
| 7,576,439 | B2 | 8/2009 | Craig et al. | |
| 7,578,422 | B2 | 8/2009 | Lange et al. | |
| 7,621,436 | B2 | 11/2009 | Mii et al. | |
| 7,633,765 | B1 | 12/2009 | Scanlan et al. | |
| 7,646,102 | B2 | 1/2010 | Boon | |
| 7,671,457 | B1 | 3/2010 | Hiner et al. | |
| 7,671,459 | B2 | 3/2010 | Corisis et al. | |
| 7,675,152 | B2 | 3/2010 | Gerber et al. | |
| 7,677,429 | B2 | 3/2010 | Chapman et al. | |
| 7,682,962 | B2 | 3/2010 | Hembree | |
| 7,728,443 | B2 | 6/2010 | Hembree | |
| 7,737,545 | B2 | 6/2010 | Fjelstad et al. | |
| 7,757,385 | B2 | 7/2010 | Hembree | |
| 7,777,351 | B1* | 8/2010 | Berry et al. | 257/778 |
| 7,780,064 | B2 | 8/2010 | Wong et al. | |
| 7,808,093 | B2 | 10/2010 | Kagaya et al. | |
| 7,842,541 | B1* | 11/2010 | Rusli et al. | 438/106 |
| 7,850,087 | B2 | 12/2010 | Hwang et al. | |
| 7,855,462 | B2 | 12/2010 | Boon et al. | |
| 7,880,290 | B2 | 2/2011 | Park | |
| 7,892,889 | B2 | 2/2011 | Howard et al. | |
| 7,919,846 | B2 | 4/2011 | Hembree | |
| 7,934,313 | B1* | 5/2011 | Lin et al. | 29/841 |
| 7,964,956 | B1 | 6/2011 | Bet-Shliemoun | |
| 7,967,062 | B2 | 6/2011 | Campbell et al. | |
| 7,977,597 | B2 | 7/2011 | Roberts et al. | |
| 8,012,797 | B2* | 9/2011 | Shen et al. | 438/107 |
| 8,020,290 | B2 | 9/2011 | Sheats | |
| 8,039,970 | B2 | 10/2011 | Yamamori et al. | |
| 8,071,470 | B2 | 12/2011 | Khor et al. | |
| 8,084,867 | B2 | 12/2011 | Tang et al. | |
| 8,093,697 | B2* | 1/2012 | Haba et al. | 257/678 |
| 8,213,184 | B2 | 7/2012 | Knickerbocker | |
| 8,232,141 | B2 | 7/2012 | Choi et al. | |
| 2001/0002607 | A1 | 6/2001 | Sugiura et al. | |
| 2001/0007370 | A1 | 7/2001 | Distefano | |
| 2001/0028114 | A1 | 10/2001 | Hosomi | |
| 2002/0014004 | A1 | 2/2002 | Beaman et al. | |
| 2002/0066952 | A1 | 6/2002 | Taniguchi et al. | |
| 2002/0117330 | A1 | 8/2002 | Eldridge et al. | |
| 2002/0125571 | A1 | 9/2002 | Corisis et al. | |
| 2002/0153602 | A1 | 10/2002 | Tay et al. | |
| 2002/0164838 | A1 | 11/2002 | Moon et al. | |
| 2002/0185735 | A1 | 12/2002 | Sakurai et al. | |
| 2003/0006494 | A1 | 1/2003 | Lee et al. | |
| 2003/0048108 | A1 | 3/2003 | Beaman et al. | |
| 2003/0057544 | A1 | 3/2003 | Nathan et al. | |
| 2003/0106213 | A1 | 6/2003 | Beaman et al. | |
| 2003/0124767 | A1 | 7/2003 | Lee et al. | |
| 2003/0162378 | A1 | 8/2003 | Mikami | |
| 2003/0164540 | A1 | 9/2003 | Lee et al. | |
| 2004/0036164 | A1 | 2/2004 | Koike et al. | |
| 2004/0038447 | A1 | 2/2004 | Corisis et al. | |
| 2004/0075164 | A1 | 4/2004 | Pu et al. | |
| 2004/0090756 | A1 | 5/2004 | Ho et al. | |
| 2004/0110319 | A1 | 6/2004 | Fukutomi et al. | |
| 2004/0119152 | A1 | 6/2004 | Karnezos et al. | |
| 2004/0124518 | A1 | 7/2004 | Karnezos | |
| 2004/0148773 | A1 | 8/2004 | Beaman et al. | |
| 2004/0152292 | A1 | 8/2004 | Babinetz et al. | |
| 2004/0160751 | A1 | 8/2004 | Inagaki et al. | |
| 2004/0188499 | A1 | 9/2004 | Nosaka | |
| 2004/0262734 | A1 | 12/2004 | Yoo | |
| 2005/0035440 | A1 | 2/2005 | Mohammed | |
| 2005/0062492 | A1 | 3/2005 | Beaman et al. | |
| 2005/0082664 | A1 | 4/2005 | Funaba et al. | |
| 2005/0095835 | A1 | 5/2005 | Humpston et al. | |
| 2005/0116326 | A1 | 6/2005 | Haba et al. | |
| 2005/0133916 | A1 | 6/2005 | Karnezos | |
| 2005/0133932 | A1 | 6/2005 | Pohl et al. | |
| 2005/0140265 | A1 | 6/2005 | Hirakata | |
| 2005/0151235 | A1 | 7/2005 | Yokoi | |
| 2005/0151238 | A1 | 7/2005 | Yamunan | |
| 2005/0173805 | A1 | 8/2005 | Damberg et al. | |
| 2005/0181544 | A1 | 8/2005 | Haba et al. | |
| 2005/0181655 | A1 | 8/2005 | Haba et al. | |
| 2005/0266672 | A1 | 12/2005 | Jeng et al. | |
| 2005/0285246 | A1 | 12/2005 | Haba et al. | |
| 2006/0118641 | A1 | 6/2006 | Hwang et al. | |
| 2006/0166397 | A1 | 7/2006 | Lau et al. | |
| 2006/0197220 | A1 | 9/2006 | Beer | |
| 2006/0278682 | A1 | 12/2006 | Lange et al. | |
| 2007/0015353 | A1 | 1/2007 | Craig et al. | |
| 2007/0148822 | A1* | 6/2007 | Haba et al. | 438/110 |
| 2007/0181989 | A1 | 8/2007 | Corisis et al. | |
| 2007/0190747 | A1 | 8/2007 | Humpston et al. | |
| 2007/0271781 | A9 | 11/2007 | Beaman et al. | |
| 2007/0290325 | A1 | 12/2007 | Wu et al. | |
| 2008/0017968 | A1 | 1/2008 | Choi et al. | |
| 2008/0032519 | A1 | 2/2008 | Murata | |
| 2008/0047741 | A1 | 2/2008 | Beaman et al. | |
| 2008/0048309 | A1 | 2/2008 | Corisis et al. | |
| 2008/0048690 | A1 | 2/2008 | Beaman et al. | |
| 2008/0048691 | A1 | 2/2008 | Beaman et al. | |
| 2008/0048697 | A1 | 2/2008 | Beaman et al. | |
| 2008/0054434 | A1 | 3/2008 | Kim | |
| 2008/0073771 | A1 | 3/2008 | Seo et al. | |
| 2008/0100316 | A1 | 5/2008 | Beaman et al. | |
| 2008/0100317 | A1 | 5/2008 | Beaman et al. | |
| 2008/0100318 | A1 | 5/2008 | Beaman et al. | |
| 2008/0100324 | A1 | 5/2008 | Beaman et al. | |
| 2008/0106281 | A1 | 5/2008 | Beaman et al. | |
| 2008/0106282 | A1 | 5/2008 | Beaman et al. | |
| 2008/0106283 | A1 | 5/2008 | Beaman et al. | |
| 2008/0106284 | A1 | 5/2008 | Beaman et al. | |
| 2008/0106285 | A1 | 5/2008 | Beaman et al. | |
| 2008/0106291 | A1 | 5/2008 | Beaman et al. | |
| 2008/0106872 | A1 | 5/2008 | Beaman et al. | |
| 2008/0111568 | A1 | 5/2008 | Beaman et al. | |
| 2008/0111569 | A1 | 5/2008 | Beaman et al. | |
| 2008/0111570 | A1 | 5/2008 | Beaman et al. | |
| 2008/0112144 | A1 | 5/2008 | Beaman et al. | |
| 2008/0112145 | A1 | 5/2008 | Beaman et al. | |
| 2008/0112146 | A1 | 5/2008 | Beaman et al. | |
| 2008/0112147 | A1 | 5/2008 | Beaman et al. | |
| 2008/0112148 | A1 | 5/2008 | Beaman et al. | |
| 2008/0112149 | A1 | 5/2008 | Beaman et al. | |
| 2008/0116912 | A1 | 5/2008 | Beaman et al. | |
| 2008/0116913 | A1 | 5/2008 | Beaman et al. | |
| 2008/0116914 | A1 | 5/2008 | Beaman et al. | |
| 2008/0116915 | A1 | 5/2008 | Beaman et al. | |
| 2008/0116916 | A1 | 5/2008 | Beaman et al. | |
| 2008/0117611 | A1 | 5/2008 | Beaman et al. | |
| 2008/0117612 | A1 | 5/2008 | Beaman et al. | |
| 2008/0117613 | A1 | 5/2008 | Beaman et al. | |
| 2008/0121879 | A1 | 5/2008 | Beaman et al. | |
| 2008/0123310 | A1 | 5/2008 | Beaman et al. | |
| 2008/0129319 | A1 | 6/2008 | Beaman et al. | |
| 2008/0129320 | A1 | 6/2008 | Beaman et al. | |
| 2008/0132094 | A1 | 6/2008 | Beaman et al. | |
| 2008/0156518 | A1 | 7/2008 | Honer et al. | |
| 2008/0164595 | A1 | 7/2008 | Wu et al. | |
| 2008/0211084 | A1 | 9/2008 | Chow et al. | |
| 2008/0284045 | A1 | 11/2008 | Gerber et al. | |
| 2008/0303153 | A1 | 12/2008 | Oi et al. | |
| 2008/0315385 | A1 | 12/2008 | Gerber et al. | |
| 2009/0050994 | A1 | 2/2009 | Ishihara et al. | |
| 2009/0085185 | A1 | 4/2009 | Byun et al. | |
| 2009/0091009 | A1 | 4/2009 | Corisis et al. | |
| 2009/0102063 | A1* | 4/2009 | Lee et al. | 257/778 |
| 2009/0104736 | A1 | 4/2009 | Haba et al. | |
| 2009/0127686 | A1 | 5/2009 | Yang et al. | |
| 2009/0128176 | A1 | 5/2009 | Beaman et al. | |
| 2009/0160065 | A1 | 6/2009 | Haba et al. | |
| 2009/0189288 | A1 | 7/2009 | Beaman et al. | |
| 2009/0206461 | A1 | 8/2009 | Yoon | |
| 2009/0212442 | A1 | 8/2009 | Chow et al. | |
| 2009/0236700 | A1 | 9/2009 | Moriya | |
| 2009/0236753 | A1 | 9/2009 | Moon et al. | |
| 2009/0261466 | A1 | 10/2009 | Pagaila et al. | |
| 2009/0315579 | A1 | 12/2009 | Beaman et al. | |
| 2010/0007009 | A1 | 1/2010 | Chang et al. | |
| 2010/0025835 | A1 | 2/2010 | Oh et al. | |

| | | | |
|---|---|---|---|
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0090330 A1 | 4/2010 | Nakazato |
| 2010/0117212 A1 | 5/2010 | Corisis et al. |
| 2010/0133675 A1 | 6/2010 | Yu et al. |
| 2010/0224975 A1 | 9/2010 | Shin et al. |
| 2010/0232129 A1 | 9/2010 | Haba et al. |
| 2010/0314748 A1 | 12/2010 | Hsu et al. |
| 2011/0115081 A1 | 5/2011 | Osumi |
| 2011/0272449 A1 | 11/2011 | Pirkle et al. |
| 2012/0043655 A1 | 2/2012 | Khor et al. |
| 2012/0119380 A1 | 5/2012 | Haba |

FOREIGN PATENT DOCUMENTS

| | | |
|---|---|---|
| JP | 61125062 A | 6/1986 |
| JP | 62-226307 | 10/1987 |
| JP | 1012769 A | 1/1989 |
| JP | 62-68015 A | 9/1994 |
| JP | 07-122787 A | 5/1995 |
| JP | 11-074295 A | 3/1999 |
| JP | 11135663 A | 5/1999 |
| JP | 2001196407 A | 7/2001 |
| JP | 2003122611 A | 4/2003 |
| JP | 2003-174124 | 6/2003 |
| JP | 2003307897 A | 10/2003 |
| JP | 2004327856 A | 11/2004 |
| JP | 2004343030 A | 12/2004 |
| JP | 2003377641 A | 6/2005 |
| JP | 2005142378 A | 6/2005 |
| JP | 2003426392 A | 7/2005 |
| JP | 2005183880 A | 7/2005 |
| JP | 2007123595 A | 5/2007 |
| JP | 2009004650 A | 1/2009 |
| JP | 2009260132 A | 11/2009 |
| JP | 2010103129 A | 5/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20100033012 A | 3/2010 |
| KR | 20100062315 A | 6/2010 |
| KR | 101011863 | 1/2011 |
| WO | 02/13256 A1 | 2/2002 |

OTHER PUBLICATIONS

International Search Report and Written Opinion for Application No. PCT/US2011/044346 dated May 11, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, Apr. 5, 2006.
Kim et al., "Application of Through Mold Via (TMV) as PoP base package", 6 pages (2008).
Kim, et al., Application of Through Mold Via (TMV) as PoP base package, ECTC, 2008.
Korean Search Report KR10-2011-0041843 dated Feb. 24, 2011.
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action from U.S. Appl. No. 12/769,930 mailed May 5, 2011.
Partial International Search Report from Invitation to Pay Additional Fees for Application No. PCT/US2012/028738 dated Jun. 6, 2012.
"EE Times Asia" [online]. [Retrieved Aug. 5, 2010]. Retrieved from internet. <http://www.eetasia.com/ART_8800428222_480300_nt_dec52276.HTM>, 4 pages.
"Wafer Level Stack—WDoD", [online]. [Retrieved Aug. 5, 2010]. Retrieved from the internet. <http://www.3d-plus.com/techno-wafer-level-stack-wdod.php>, 2 pages.
International Search Report and Written Opinion for PCT/US2011/060551 dated Apr. 18, 2012.
Jin, Yonggang et al., "STM 3D-IC Package and 3D eWLB Development," STMicroelectronics Singapore/STMicroelectronics France.
Redistributed Chip Package (RCP) Technology, Freescale Semiconductor, 2005, 6 pages.
Search Report from Korean Patent Applicatin No. 10-2010-0113271 dated Jan. 12, 2011.
Yoon, PhD, Seung Wook, "Next Generation Wafer Level Packaging Solution for 3D integration," May 2010, STATS ChipPAC Ltd.

\* cited by examiner

STACKABLE MOLDED MICROELECTRONIC PACKAGES

FIELD OF THE INVENTION

The present invention relates to microelectronic packages and to methods of making or testing microelectronic packages.

BACKGROUND OF THE INVENTION

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Assemblies including packages can suffer from stresses imposed by differential thermal expansion and contraction of the device and the substrate. During operation, as well as during manufacture, a semiconductor chip tends to expand and contract by an amount different from the amount of expansion and contraction of a circuit board. Where the terminals of the package are fixed relative to the chip or other device, such as by using solder, these effects tend to cause the terminals to move relative to the contact pads on the circuit board. This can impose stresses in the solder that connects the terminals to the contact pads on the circuit board. As disclosed in certain preferred embodiments of U.S. Pat. Nos. 5,679,977; 5,148,266; 5,148,265; 5,455,390; and 5,518,964, the disclosures of which are incorporated by reference herein, semiconductor chip packages can have terminals that are movable with respect to the chip or other device incorporated in the package. Such movement can compensate to an appreciable degree for differential expansion and contraction.

Testing of packaged devices poses another formidable problem. In some manufacturing processes, it is necessary to make temporary connections between the terminals of the packaged device and a test fixture, and operate the device through these connections to assure that the device is fully functional. Ordinarily, these temporary connections must be made without bonding the terminals of the package to the test fixture. It is important to assure that all of the terminals are reliably connected to the conductive elements of the test fixture. However, it is difficult to make connections by pressing the package against a simple test fixture such as an ordinary circuit board having planar contact pads. If the terminals of the package are not coplanar, or if the conductive elements of the test fixture are not coplanar, some of the terminals will not contact their respective contact pads on the test fixture. For example, in a BGA package, differences in the diameter of the solder balls attached to the terminals, and non-planarity of the chip carrier, may cause some of the solder balls to lie at different heights.

These problems can be alleviated through the use of specially constructed test fixtures having features arranged to compensate for non-planarity. However, such features add to the cost of the test fixture and, in some cases, introduce some unreliability into the test fixture itself. This is particularly undesirable because the test fixture, and the engagement of the device with the test fixture, should be more reliable than the packaged devices themselves in order to provide a meaningful test. Moreover, devices used for high-frequency operation are typically tested by applying high frequency signals. This requirement imposes constraints on the electrical characteristics of the signal paths in the test fixture, which further complicates construction of the test fixture.

Additionally, when testing packaged devices having solder balls connected with terminals, solder tends to accumulate on those parts of the test fixture that engage the solder balls. This accumulation of solder residue can shorten the life of the test fixture and impair its reliability.

A variety of solutions have been put forth to deal with the aforementioned problems. Certain packages disclosed in the aforementioned patents have terminals that can move with respect to the microelectronic device. Such movement can compensate to some degree for non-planarity of the terminals during testing.

U.S. Pat. Nos. 5,196,726 and 5,214,308, both issued to Nishiguchi et al., disclose a BGA-type approach in which bump leads on the face of the chip are received in cup-like sockets on the substrate and bonded therein by a low-melting point material. U.S. Pat. No. 4,975,079 issued to Beaman et al. discloses a test socket for chips in which dome-shaped contacts on the test substrate are disposed within conical guides. The chip is forced against the substrate so that the solder balls enter the conical guides and engage the dome-shaped pins on the substrate. Sufficient force is applied so that the dome-shaped pins actually deform the solder balls of the chip.

A further example of a BGA socket may be found in commonly assigned U.S. Pat. No. 5,802,699, issued Sep. 8, 1998, the disclosure of which is hereby incorporated by reference herein. The '699 patent discloses a sheet-like connector having a plurality of holes. Each hole is provided with at least one resilient laminar contact extending inwardly over a hole. The bump leads of a BGA device can be advanced into the holes so that the bump leads are engaged with the contacts. The assembly can be tested, and if found acceptable, the bump leads can be permanently bonded to the contacts.

Commonly assigned U.S. Pat. No. 6,202,297, issued Mar. 20, 2001, the disclosure of which is hereby incorporated by reference herein, discloses a connector for microelectronic devices having bump leads and methods for fabricating and using the connector. In one embodiment of the '297 patent, a dielectric substrate has a plurality of posts extending upwardly from a front surface. The posts may be arranged in an array of post groups, with each post group defining a gap therebetween. A generally laminar contact extends from the top of each post. In order to test a device, the bump leads of the device are each inserted within a respective gap thereby engaging the contacts which wipe against the bump lead as it continues to be inserted. Typically, distal portions of the contacts deflect downwardly toward the substrate and outwardly away from the center of the gap as the bump lead is inserted into a gap.

Commonly assigned U.S. Pat. No. 6,177,636, the disclosure of which is hereby incorporated by reference herein, discloses a method and apparatus for providing interconnections between a microelectronic device and a supporting substrate. In one preferred embodiment of the '636 patent, a method of fabricating an interconnection component for a microelectronic device includes providing a flexible chip carrier having first and second surfaces and coupling a conductive sheet to the first surface of the chip carrier. The conductive sheet is then selectively etched to produce a plurality of substantially rigid posts. A compliant layer can be provided on the second surface of the support structure and a microelectronic device such as a semiconductor chip is engaged with the compliant layer so that the compliant layer lies between the microelectronic device and the chip carrier, and leaving the posts projecting from the exposed surface of the chip carrier. The posts are electrically connected to the microelectronic device. The posts form projecting package terminals that can be engaged in a socket or solder-bonded to features of a substrate as, for example, a circuit panel. Because the posts can be movable with respect to the microelectronic device, such a package can substantially accommodate thermal coefficient of expansion mismatches between the device and a supporting substrate when the device is in use. Moreover, the tips of the posts can be coplanar or nearly coplanar.

Despite all of the above-described advances in the art, still further improvements in making or testing microelectronic packages would be desirable.

SUMMARY OF THE INVENTION

A microelectronic package has a microelectronic element overlying or mounted to a first surface of a substrate and substantially rigid conductive posts projecting above the first surface or projecting above a second surface of the substrate remote therefrom. Conductive elements exposed at a surface of the substrate opposite the surface above which the conductive posts project are electrically interconnected with the microelectronic element. An encapsulant overlies at least a portion of the microelectronic element and the surface of the substrate above which the conductive posts project, the encapsulant having a recess or a plurality of openings each permitting at least one electrical connection to be made to at least one conductive post. At least some conductive posts are electrically insulated from one another and adapted to simultaneously carry different electric potentials. In particular embodiments, the openings in the encapsulant at least partially expose conductive masses joined to posts, fully expose top surfaces of posts and partially expose edge surfaces of posts, or may only partially expose top surfaces of posts.

In one embodiment, the conductive posts project to a first height above at least one of the first or second surfaces, the encapsulant contacts the conductive posts and has a major surface at a second height above the same surface of the substrate above which the conductive posts project, the second height being greater than the first height, and the openings in the encapsulant being openings in the major surface.

In a particular embodiment, the conductive posts can project above the first surface and the conductive elements can be exposed at the second surface.

In one embodiment, the first surface can have a first region and a second region extending from the first region. The microelectronic element may overlie the first region, and the posts can be aligned with the second region.

In a particular embodiment, the conductive posts can project above the second surface and the conductive elements can be exposed at the first surface.

The major surface of the encapsulant can be a substantially planar surface. The encapsulant can further have a second surface overlying the microelectronic element at a third height above the first surface, the third height being different from the second height, for example, being greater than the second height.

In one embodiment, the major surface of the encapsulant can be a substantially planar surface which overlies the first and second regions of the first surface at an at least substantially uniform second height therefrom and overlying the microelectronic element.

In one variation, at least one conductive post can include a tip region remote from the microelectronic element and a second region disposed below the tip region and closer to the substrate. The second region and tip region can have respective concave circumferential surfaces. The at least one post can consist essentially of metal and have a horizontal dimension which is a first function of vertical location in the tip region and which is a second function of vertical location in the second region.

In one embodiment, the conductive elements include at least one of conductive posts or masses of conductive bonding material, and a portion of the encapsulant overlies the second surface. Such portion can have a major surface at a height above the second surface and at least one of a recess or one or more openings in the major surface. The recess or the one or more openings can at least partially expose at least one of the conductive elements for electrical connection thereto. At least some of the conductive elements can be electrically insulated from one another and adapted to simultaneously carry different electric potentials.

In one or more embodiments, surfaces of at least two of the conductive posts or surfaces of at least two conductive masses are at least partially exposed within a single one of the openings.

A method of making a microelectronic package is provided in accordance with one embodiment. Such method can include providing a microelectronic assembly including a substrate, a microelectronic element mounted to the substrate and substantially rigid conductive posts having top surfaces remote from the substrate. First and second ones of the conductive posts can be electrically connected by conductive features of the substrate to the microelectronic element for carrying a first signal electric potential on the first conductive post and for simultaneously carrying a second electric potential on the second conductive post, the second electric potential being different from the first signal electric potential. An encapsulant layer can then be formed overlying at least a portion of the microelectronic element and covering the top surfaces of the conductive posts. At least one of a recess or one or more openings can then be formed in the encapsulant layer. Each recess or opening can be aligned with at least one of the conductive posts and each recess or opening permitting an electrical connection to be made with at least one of the conductive posts.

In one embodiment, the encapsulant layer can contact the conductive posts and each recess or opening can at least partially expose at least one of the conductive posts.

In one embodiment, at least one individual opening can at least partially expose two or more of the conductive posts.

The microelectronic assembly may further include conductive masses joined with respective ones of the conductive posts. Each recess or opening formed in the encapsulant layer can at least partially expose at least one of the conductive masses. In a particular embodiment, at least one individual opening may at least partially expose two or more of the conductive masses.

The encapsulant layer may be formed to have a substantially planar surface, and the recess or opening can extend from or be formed in the substantially planar surface.

In one embodiment, the conductive posts can have edge surfaces extending away from the top surfaces, and the edge surface of at least one conductive post can be at least partially exposed within at least one of the openings.

In a particular embodiment, at least first and second microelectronic packages can be made, and then the second microelectronic package can be stacked atop the first microelectronic package and the first and second microelectronic packages be electrically interconnected together using the conductive posts of at least one of the first and second microelectronic packages.

In a further example, the step of forming the encapsulant layer can include forming first and second substantially planar surfaces of the encapsulant layer above a surface of the substrate. The first surface can overlie at least a portion of the substrate aligned with the microelectronic element and the second surface can overlie another portion of the substrate beyond an edge of the microelectronic element. The first and second surfaces can have different heights from the surface of the substrate.

DETAILED DESCRIPTION OF PREFERRED EMBODIMENTS

Figure 1A:
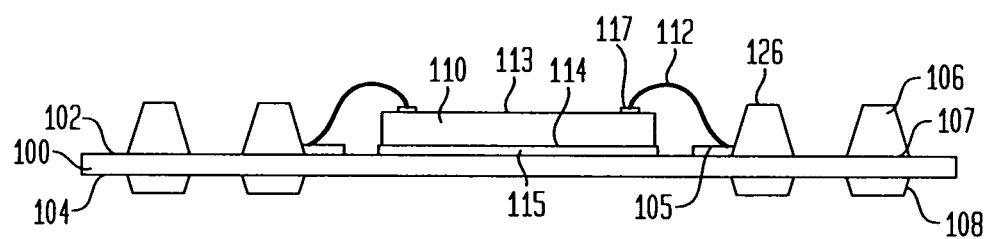
FIG. 1A is a sectional view illustrating a microelectronic assembly through lines 1A-1A of FIG. 1B.

Referring to FIG. 1A, in accordance with an embodiment of the present invention, a microelectronic package includes a substrate 100 having a first or top surface 102 adjacent a face 114 of a microelectronic element 110 and a second or bottom surface 104 opposite therefrom. The microelectronic element 110 can be a first semiconductor chip having a front face 113 facing in an upward direction toward the top of the drawing in FIG. 1A and a rear face 114 facing in the opposite, rearward direction. Rear face 114 is generally parallel to front face 113. The directions parallel to front face 113 are referred to herein as "horizontal" or "lateral" directions; whereas the directions perpendicular to the front face are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

The microelectronic element 110 includes active circuit elements which are disposed in a relatively thin layer adjacent the front face 113. The active circuit elements may include devices such as transistors, diodes and other elements, and circuits incorporating the same. Typically, the active circuit elements have dimensions on the order of a few microns or less.

The substrate 100 includes first conductive posts 106 exposed at a top surface 102 and conductive elements 108 exposed at the second surface 104 of the substrate 100. As used in this disclosure, a conductive element "exposed at" a surface of a dielectric element may be flush with such surface; recessed relative to such surface; or protruding from such surface, so long as the conductive element is accessible for contact by a theoretical point moving towards the surface in a direction perpendicular to the surface.

Figure 1B:
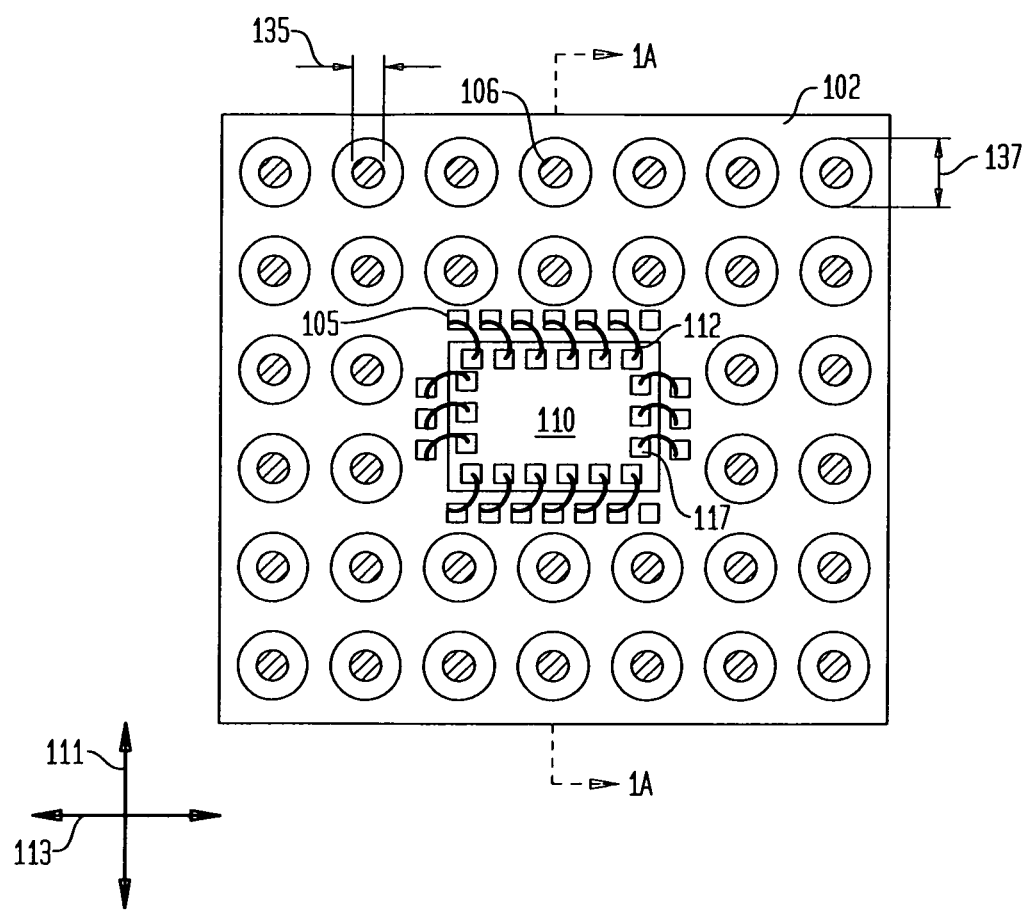
FIG. 1B is a top plan view illustrating the microelectronic assembly shown in FIG. 1A.

In the example shown in FIG. 1A, the conductive elements 108 are conductive pads. The substrate 100 may be flexible, and in one embodiment may be made of a dielectric material such as polyimide. The substrate typically has conductive may also have conductive traces (not shown) that extend over the top surface 102, the bottom surface 104 and/or between the top and bottom surfaces. A microelectronic element 110 such as a semiconductor chip is attached to the first surface 102 of a substrate 100. As seen in FIGS. 1A-B, contacts 117 of the microelectronic element can be electrically interconnected with one or more conductive pads 105 using conductive elements 112 such as wire bonds. In turn, the conductive pads 105 can be connected with conductive posts 106. At least some of the conductive posts are electrically insulated from one another and are adapted to carry different electric potentials, for example, different signals, or different voltages, e.g., power, ground, or a combination thereof. An adhesive 115 can be used for attaching to the substrate 100 a rear face 114 of the microelectronic element 110 opposite the front, i.e., contact-bearing face to the substrate 100.

When viewed from above the top surface 102 of the substrate, the base 107 of each conductive post can have an area in contact with the bond layer which can be larger than the top surface 126 of the post. The base 107 may have circular, elliptical, oblong or other rectangular or polygonal shape, for example. The top surface 126 may define a tip or apex of the post. The top surface or tip, which is disposed above the top surface 102 of the substrate, can have a smaller area than the base. Typically, the tip has the same shape as the base when viewed from above the top surface 102. The shape of the post is rather arbitrary and may be not only frusto-conical, i.e., a truncated cone which is a part of a cone whose apex is cut off along a face parallel or generally parallel to its bottom face, as shown in the drawings. Alternatively, the conductive posts can have cylindrical, conical, or any other similar shape, such as, for example, a cone with round top or a plateau shape. Furthermore, in addition to or rather than the three dimensional (3D) shape having a circular cross-section, which is called a "solid of revolution", such as the truncated cone, the post 130 may have an arbitrary shape such as any three dimensional shape having a polygonal horizontal cross-section. Typically, the shape can be adjusted by changing the resist pattern, etching conditions or the thickness of the original layer or metal foil from which the post is formed. Although the dimensions of the post 106 are also arbitrary and are not limited to any particular ranges, often, it may be formed to project from an exposed surface of the substrate 100 by 50 to 300 micrometers, and if the post has the circular cross-section, the diameter may be set in a range of a few tens of microns and greater. In a particular embodiment the diameter of the post can range between 0.1 mm and 10 mm. In a particular embodiment, the material of the post 106 can be copper or copper alloy. The copper alloy can include an alloy of copper with any other metal or metals. The structure and details of fabricating posts and substrates having posts can be as described in United States Patent Publication 2007-0148822.

Typically, the posts can be formed by etching a layer of metal, e.g., a foil laminated to a substrate, isotropically, with a mask 14 (FIG. 1C) disposed on or above the metal foil such that etching proceeds downwardly from the surface of the metal foil in contact with the mask 14 in a direction of a thickness 10 of the metal foil, i.e., towards the top surface 102 of the substrate below. Etching can proceed until top surface 102 of the substrate 100 is fully exposed between posts such that the top surface 126 (FIG. 1A) of each post has the same height from the top surface 102 of the substrate and the top surfaces 126 are co-planar. The width 12 of the mask 14 typically is greater than a width of the conductive post 106 at the surface in contact with the mask.

The width 135 (FIG. 2) of the tip can be the same or different in the lateral directions 111, 113 in which the substrate extends. When the width is the same in the two directions, the width can represent a diameter of the tip. Likewise, the width 137 of the base can be the same or different in lateral directions 111, 113 of the metal foil, and when it is the same, the width 137 can represent a diameter of the base. In one embodiment, the tip can have a first diameter, and the base can have a second diameter, wherein a difference between the first and second diameters can be greater than 25% of the height of the post extending between the tip and base of the post.

Figure 1C:
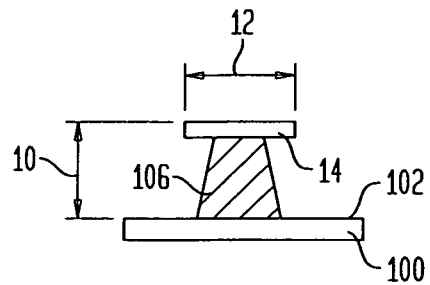
FIG. 1C is a partial sectional view illustrating a conductive post formed in accordance with an embodiment of the invention.

FIG. 1C illustrates a substrate after forming a conductive post 106 by etching completely through a metal foil to expose the underlying substrate 100. In a particular example, the conductive posts can have a height from a few tens of microns and lateral dimensions, e.g., diameter from a few tens of microns. In a particular example, the height and diameter can each be less than 100 microns. The diameter of the posts is less than the lateral dimensions of the conductive pads. The height of each post can be less than or greater than the post's diameter.

Figure 1D:
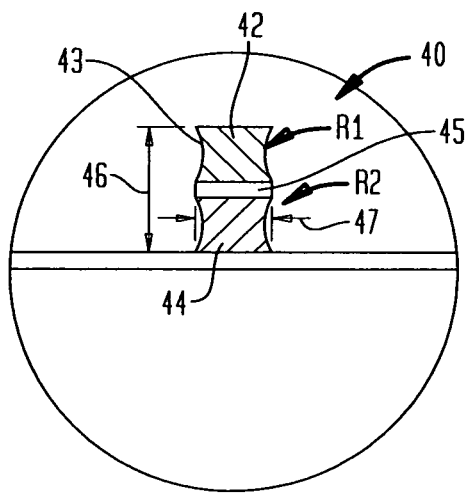
FIG. 1D is a partial sectional view illustrating a post according to a variation of the post shown in FIG. 1C.
Figure 1E:
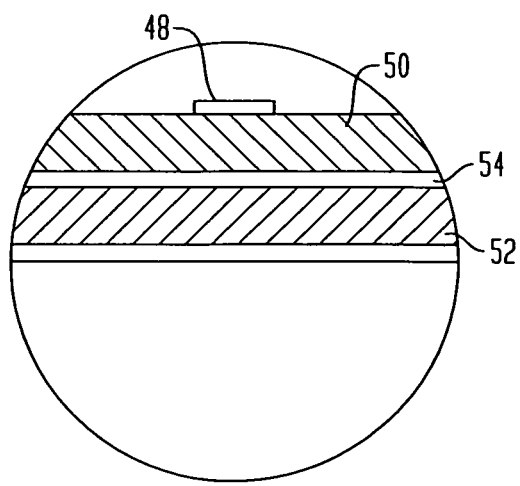
FIG. 1E is a partial sectional view illustrating a method of forming a post as shown in FIG. 1D.

FIG. 1D illustrates an alternative embodiment in which the post 40 is formed with a base having a width 47 which can be narrower in relation to a height 46 of the post than the width 137 (FIG. 1B) of the base when the post is formed as discussed with reference to FIG. 1C. Thus, a post 40 having a greater height to width aspect ratio may be obtained than the post formed as discussed above. In a particular embodiment, the post 40 can be formed by etching portions of a layered structure (FIG. 1E) using a masking layer 48, where the layered structure including a first metal foil 50, a second metal foil 52 and an etch barrier layer 54 disposed between, e.g., sandwiched between the first metal foil and the second metal foil. The resulting post 40 can have an upper post portion 42 and a lower post portion 44 and can have an etch barrier layer 45 disposed between the upper and lower post portions. In one example, the metal foil consists essentially of copper and the etch barrier 45 consists essentially of a metal such as nickel that is not attacked by an etchant that attacks copper. Alternatively, the etch barrier 45 can consist essentially of a metal or metal alloy that can be etched by the etchant used to pattern the metal foil, except that the etch barrier 45 is etched more slowly than the metal foil. In such manner, the etch barrier protects the second metal foil 52 from attack when the first metal foil is being etched in accordance with masking layer 48 to define an upper post portion 42. Then, portions of the etch barrier 45 exposed beyond an edge 43 of the upper post portion 42 are removed, after which the second metal foil 52 is etched, using the upper post portion as a mask.

The resulting post 40 can include a first etched portion having a first edge, wherein the first edge has a first radius of curvature R1. The post 40 also has at least one second etched portion between the first etched portion and the top surface of the substrate, wherein the second etched portion has a second edge having a second radius of curvature R2 that is different from the first radius of curvature. Another way that the post 40 can be described is that each conductive post includes a tip region, remote from the substrate and a second region disposed below the tip region closer to the substrate, the second region and tip region having respective concave circumferential surfaces, and each solid metal post has a horizontal dimension which is a first function of vertical location in the tip region and which is a second function of vertical location in the second region.

In one embodiment, the upper post portion 42 may be partially or fully protected from further attack when etching the second metal foil to form the lower post portion. For example, to protect the upper post portion, an etch-resistant material can be applied to an edge or edges 43 of the upper post portion prior to etching the second metal foil. Further description and methods of forming etched metal posts similar to the posts 40 shown in FIG. 1D are described in commonly owned U.S. application Ser. No. 11/717,587 filed Mar. 13, 2007 (Tessera 3.0-358 CIP CIP), the disclosure of which is incorporated herein by reference.

Figure 1F:
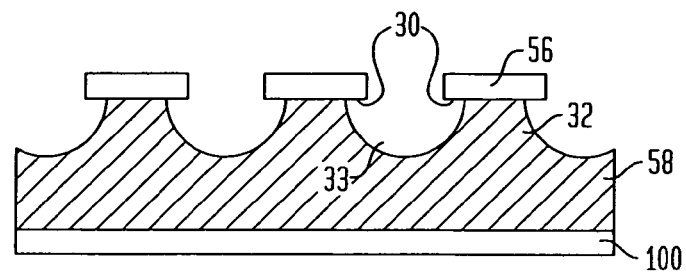
FIGS. 1F, 1G, 1H, and 1I are partial sectional views illustrating stages in a fabrication method relating to the forming of posts.

In one example, the starting structure need not include an etch barrier layer sandwiched between first and second metal foils. Instead, the upper post portion can be formed by incompletely etching, e.g., "half-etching" a metal foil, such that projecting portions 32 (FIG. 1F) of the metal foil are defined as well as recesses 33 between the projecting portions where the metal foil has been exposed to the etchant. After exposure and development of a photoresist as a masking layer 56, the foil 58 can be etched as shown in FIG. 1F. Once a certain depth of etching is reached, the etching process is interrupted. For example, the etching process can be terminated after a predetermined time. The etching process leaves first post portions 32 projecting upwardly away from the substrate 100 with recesses 33 defined between the first portions. As the etchant attacks the foil 58, it removes material beneath the edges of masking layer 56, allowing the masking layer to project laterally from the top of the first post portions 32, denoted as overhang 30. The first masking layer 56 remains at particular locations as shown.

Figure 1G:
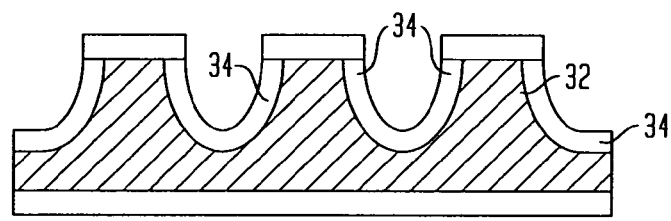

Once the foil 58 has been etched to a desired depth, a second layer of photoresist 34 (FIG. 1G) is deposited onto an exposed surface of the foil 58. In this instance, the second photoresist 34 can be deposited onto the recesses 33 within the foil 58, i.e., at locations where the foil has been previously etched. Thus, the second photoresist 34 also covers the first post portions 32. In one example, an electrophoretic deposition process can be used to selectively form the second layer of photoresist on the exposed surface of the foil 58. In such case, the second photoresist 34 can be deposited onto the foil without covering the first photoresist masking layer 56.

Figure 1H:
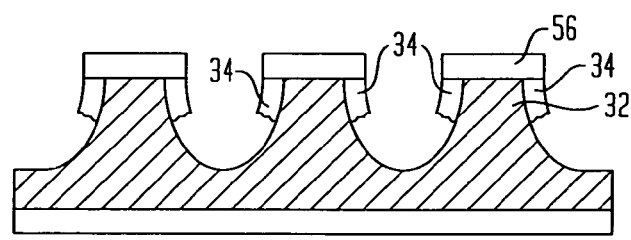

At the next step, the substrate with the first and second photoresists 56 and 34 is exposed to radiation and then the second photoresist is developed. As shown in FIG. 1H, the first photoresist 56 can project laterally over portions of the foil 58, denoted by overhang 30. This overhang 30 prevents the second photoresist 34 from being exposed to radiation and thus prevents it from being developed and removed, causing portions of the second photoresist 34 to adhere to the first post portions 32. Thus, the first photoresist 56 acts as a mask to the second photoresist 34. The second photoresist 34 is developed by washing so as to remove the radiation exposed second photoresist 34. This leaves the unexposed portions of second photoresist 34 on the first post portions 32.

Figure 1I:
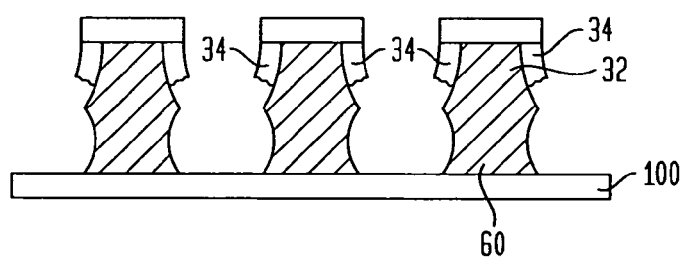

Once portions of the second photoresist 34 have been exposed and developed, a second etching process is performed, removing additional portions of the foil 56, thereby forming second post portions 36 below the first post portions 32 as shown in FIG. 1I. During this step, the second photoresist 34, still adhered to first post portions 32, protects the first post portions 32 from being etched again. Thereafter, the first and second photoresist masks 56, 34 can be removed, leaving posts 60 projecting from a major surface of the substrate 100.

These steps may be repeated as many times as desired to create the preferred aspect ratio and pitch forming third, fourth or nth post portions. The process may be stopped when the substrate 100 is reached, such layer which can act as an etch-stop or etch-resistance layer. As a final step, the first and second photoresists 58 and 34, respectively, may be stripped entirely.

In such manner, posts 60 (FIG. 1I) having a shape similar to the shape of posts 40 (FIG. 1D) can be formed, but without requiring an internal etch barrier 45 to be provided between upper and lower post portions as seen in FIG. 1D. Using such method, posts having a variety of shapes can be fabricated, in which the upper post portions and lower post portions can have similar diameters, or the diameter of the upper post portion can be larger or smaller than that of a lower post portion. In a particular embodiment, the diameter of the post can become progressively smaller from tip to base or can become progressively larger from tip to base, by successively forming portions of the posts from the tips to the bases thereof using the above-described techniques.

Figure 2:
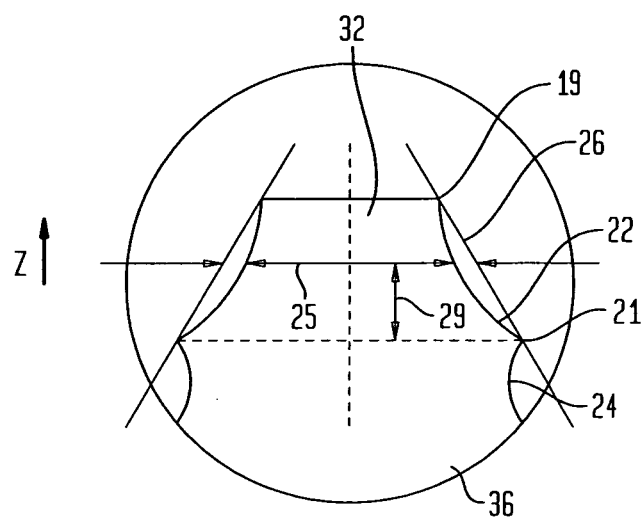
FIG. 2 is a partial fragmentary sectional view further illustrating a post as shown in FIG. 1I.

The posts 60 formed by the above-described process (FIGS. 1F-1I) can be as shown in FIG. 2. Each post 60 can have a first portion 32 at or adjacent to a tip region and a second portion 36 underlying the first portion and closer to the substrate surface. A circumferential surface 22 of the first portion 32 and the circumferential surface 24 of the second portion 36 are concave surfaces, and each has a slope or dX/dZ which changes at most gradually with position in the Z direction (direction of height above the substrate surface). With respect to each of the circumferential surfaces of the posts described herein (e.g., surface 22, or surface 24, "concave" means that at every height between the boundaries of the circumferential surfaces (e.g., at every height 29 between an upper boundary 19 of the circumferential surface 22 and a lower boundary 21 of that circumferential surface 22, the circumferential surface encloses a smaller diameter 25 than the diameter, at the same height 29, enclosed by a theoretical conical surface defined by a series of straight lines extending between the boundaries. For example, every point on circumferential surface 22 between boundaries 19, 21 lies inward from the theoretical conical surface 26 defined by a series of straight lines extending through the boundaries 19, 21.

Instead of forming posts by etching, as in the above-described processes, it is also possible to form posts by a plating process in which a sacrificial layer such as a photoresist layer is deposited on the top surface of the substrate, after which openings are formed therein by photolithography. The openings define the locations at which a metal can be plated to form the posts. Typically the posts formed by this method have uniform cross-section from base to tip, and can be cylindrical in shape, for example.

Figure 3:
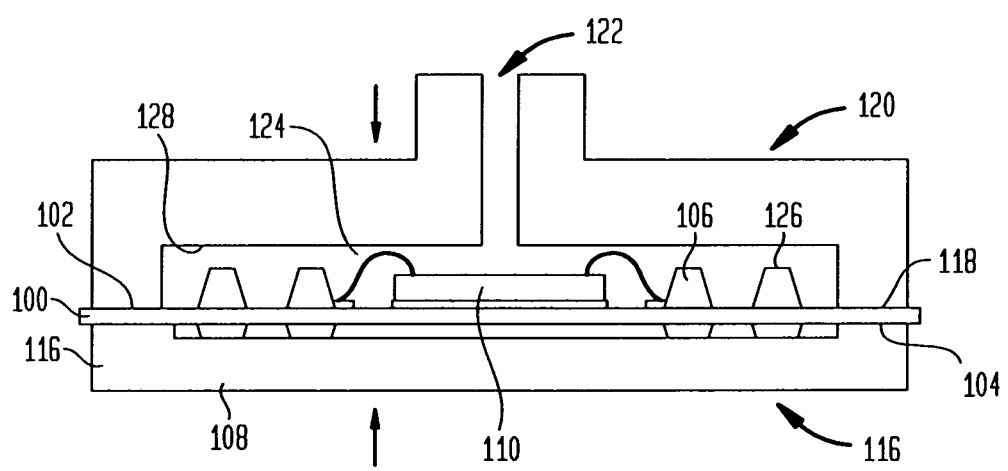
FIG. 3 is a sectional view illustrating a molding stage in a method of fabricating a microelectronic package in accordance with an embodiment of the invention.

Referring to FIG. 3, once the posts are formed, the substrate 100 may be placed between top and bottom plates 116, 120 of a mold. The top plate 120 is positioned over the bottom plate 116 for capturing the substrate 100 therebetween. Specifically, the top plate 120 of the mold can be placed in contact with the first surface 102 of the substrate and the bottom plate 116 of the mold can be in contact with the second surface 104 of the substrate 100. The mold top plate 120 can include an inlet 122 that enables a flowable material to be introduced into a cavity 124 defined by the mold bottom plate 116 and the mold top plate 120.

The top plate 120 of the mold can be pressed against a top surface 102 of the substrate to define an interior cavity 124 having a volume. An interior surface 128 of the top plate 120 can be juxtaposed with and spaced apart from top surfaces 126 of the conductive posts 106. The bottom plate 116 can provide counter-force against the substrate 110 during the molding process. Then, a curable, flowable material such as a curable encapsulant can be introduced into the cavity 124 of the mold through the inlet 122. The curable encapsulant may be clear, opaque or have optical properties anywhere along the scale between clear and opaque. For example, the encapsulant may be clear when the microelectronic element 110 includes active devices which emit or receive visible wavelength spectra. The curable material is preferably cured to form a cured encapsulant layer, which preferably provides stability to the package and protects the microelectronic element 110, the conductive wire bonds 112 and the conductive posts 106.

Figure 4:
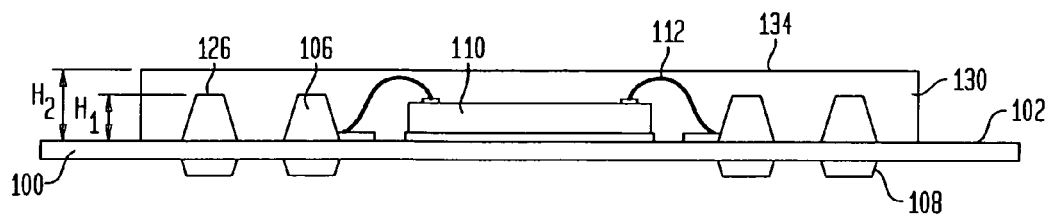
FIG. 4 is a sectional view illustrating a stage of a fabrication method subsequent to the stage shown in FIG. 3.

Referring to FIG. 4, the top surfaces 126 of the conductive posts 106 extend to a first height $H_1$ from the top surface 102 of the substrate 100. After molding, the encapsulant 130 can have a major surface 134 at a height $H_2$ that is sufficient to cover the semiconductor chip 110, the wire bonds 112 and the conductive posts 106. In the particular embodiment shown in FIG. 4, the major surface 134 can be at a uniform height from a first region of the surface 102 to which the microelectronic element is mounted as well as a second region of the surface 102 above which the conductive posts 126 project. The height $H_1$ of the conductive posts 106 above the top surface 102 of the substrate 100 is less than the height $H_2$ of the encapsulant major surface, such that top surfaces 126 of the conductive posts are buried below the major surface 134.

Figure 5:
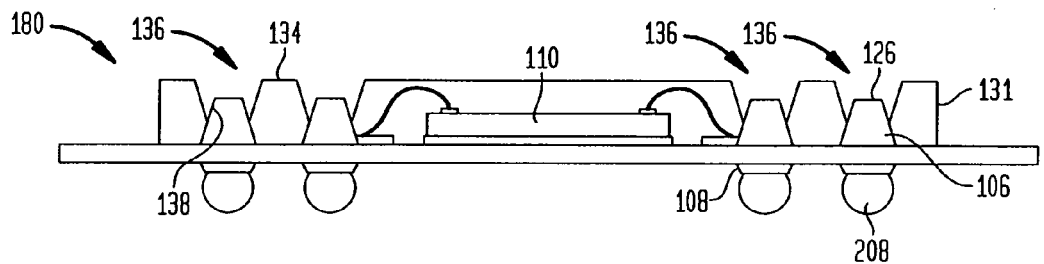
FIG. 5 is a sectional view illustrating a microelectronic package in accordance with an embodiment of the invention.

FIG. 5 illustrates a subsequent step of fabrication in which openings 136 are formed in the encapsulant major surface 134 which at least partially expose conductive posts 106. In one embodiment, the openings 136 can be formed after the encapsulant has been cured. Alternatively, in a variation the openings 136 can be formed after the package is removed from the mold at which time the encapsulant may only be partially cured. In such variation, full curing of the encapsulant can occur after the openings 136 are made therein. As particularly shown in FIG. 5, the openings 136 can be formed so as to at least partially expose the top surface 126 but also at least partially expose edge surfaces 138 of individual conductive posts. For this purpose, a laser can be used to ablate the encapsulant material above top surfaces of conductive posts 106 so as to form openings 136. Mechanical drilling or etching are other possible ways of forming openings in the encapsulant.

The openings may be formed so as to fully or partially expose one or more of the conductive posts. In a particular example, at least one of the openings can only partially expose a single conductive post. In this way, the opening can provide a conduit in the encapsulant layer insulating an electrical connection between the conductive post and a corresponding conductive element of a circuit panel or other element, e.g., another microelectronic package, to which the conductive post can be connected.

In a particular case, an opening may expose more than one conductive post. In one such example, an entire row of posts or a portion of such row can be exposed or partially exposed in one opening of the encapsulant. In another example, a plurality of rows of posts or portions of a plurality of rows of posts can be exposed or partially exposed in one opening in the major surface of the encapsulant. In a particular example, a plurality of conductive posts which are exposed or partially exposed together in a single opening or in respective openings can be connected to one or more conductive elements at the same electric potential, such as for making ground or power connections. However, in one embodiment, a single opening can at least partially expose a plurality of posts which carry different signals so that, for example, a combination of at least two of power, ground or a signal at can be carried simultaneously by at least two posts which are at least partially exposed together within a single opening in the encapsulant. FIG. 5 further illustrates conductive masses, e.g., solder balls 208 being joined with the conductive pads 108 of the substrate. The solder balls 208 can be aligned with the conductive posts for joining thereto, as will be further described below. The joining of the solder balls with conductive elements, e.g., pads, etc., of a substrate is implicit in the embodiments shown below, unless otherwise noted.

Figure 5A:
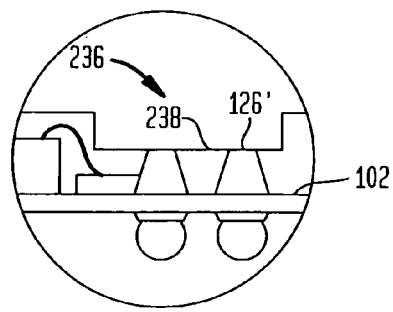
FIG. 5A is a sectional view illustrating a microelectronic package in accordance with a variation of the embodiment of the invention shown in FIG. 5.
Figure 5B:
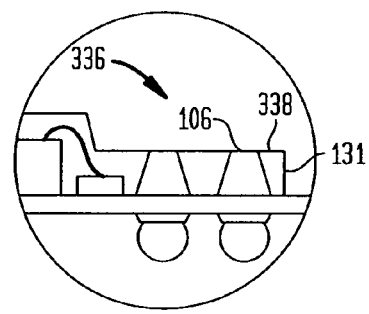
FIG. 5B is a sectional view illustrating a microelectronic package in accordance with a further variation of the embodiment of the invention shown in FIG. 5.

In a particular embodiment (FIG. 5A) in which at least two posts 106 are at least partially exposed within a single opening 236, a saw can be used to form the opening 236 extending in one or more horizontal directions across the substrate surface 102. In such case, top surfaces 126' of the conductive posts can exposed within the opening. In particular embodiments, the top surfaces 126' of the conductive posts can be disposed above the surface 238 of the encapsulant layer within the opening, below the surface 238 or can be flush with the surface 238. In the particular embodiment shown in FIG. 5A, opening 236 does not extend horizontally to a peripheral edge of the encapsulant layer, i.e., to peripheral edge 131 of the encapsulant layer as shown in FIG. 5. In one variation as seen in FIG. 5B, a saw or other means can be used to form a recess 336 in the encapsulant layer which does extend to the peripheral edge 131 of the encapsulant layer and which at least partially exposes one or a plurality of the conductive posts 106. In particular embodiments, the top surfaces 126' of the conductive posts 106 can be disposed above the recessed surface 338 of the encapsulant layer, below the recessed surface 338 or which can be flush with the recessed surface 338.

Figure 6:
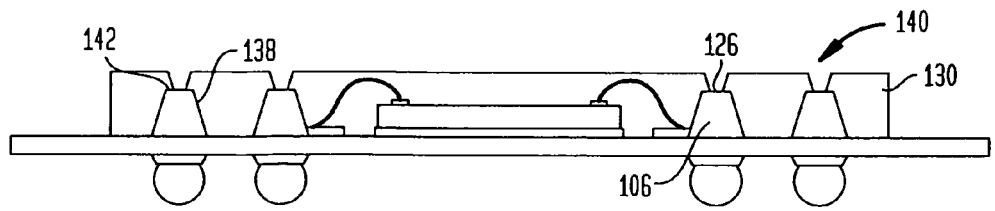
FIG. 6 is a sectional view illustrating a microelectronic package in accordance with a variation of the embodiment illustrated in FIG. 5.

FIG. 6 shows a variation of the embodiment shown in FIG. 5. In this embodiment, openings 140 are formed in such manner that the top surfaces 126 of the conductive posts 106 are only partially exposed within each opening 140. As seen in FIG. 6, portions 142 of the top surfaces 126 of the posts lie between the openings 140 and the edge surfaces 138. These portions 142 of the top surfaces of the conductive posts remain buried within the cured encapsulant layer 130 after forming the openings. Moreover, the edge surfaces 138 of the conductive posts are buried within the encapsulant in the embodiment illustrated in FIG. 6.

Figure 7:
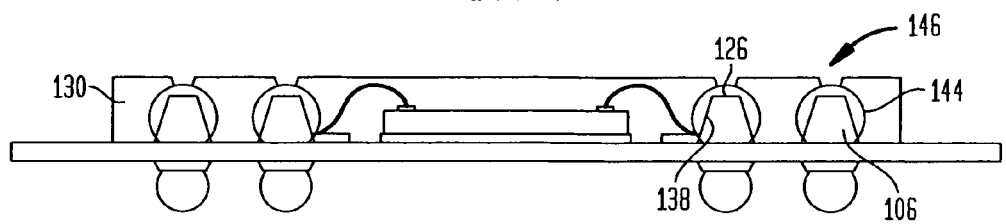
FIG. 7 is a sectional view illustrating a microelectronic package in accordance with a variation of the embodiment illustrated in FIG. 5.

FIG. 7 illustrates yet another variation in which conductive masses 144, e.g., a bonding metal such as tin, solder or other bond material, contacts top and edge surfaces 126, 138 of the conductive posts. Openings 146 formed in the cured encapsulant material 130 at least partially expose the conductive masses 144, and may also expose portions of the posts 106.

Figure 8:
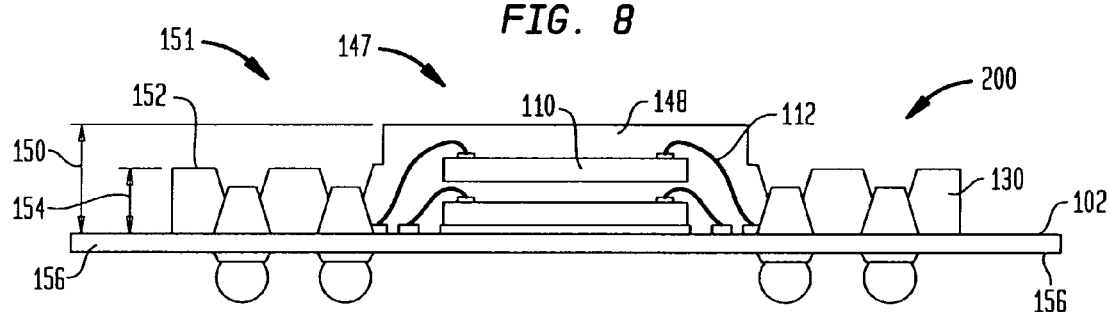
FIG. 8 is a sectional view illustrating a microelectronic package in accordance with a variation of the embodiment illustrated in FIG. 5.

FIG. 8 illustrates a variation of the microelectronic package shown in FIG. 5. In this case, the encapsulant 130 is formed to have a plurality of regions which have major surfaces at different heights from the top surface 102 of the substrate 100. As seen in FIG. 8, the encapsulant 130 includes a central region 147 which has a major surface 148 at a height 150 that is sufficient to cover the semiconductor chip 110 and the wire bonds 112. As particularly shown in FIG. 8, the package may include a plurality of microelectronic elements 110, e.g., semiconductor chips which are stacked and electrically connected with conductive elements, e.g., conductive pads of the substrate 100. Alternatively, similar to the embodiment shown in FIG. 5, the microelectronic package may include a single microelectronic element 110.

Figure 9:
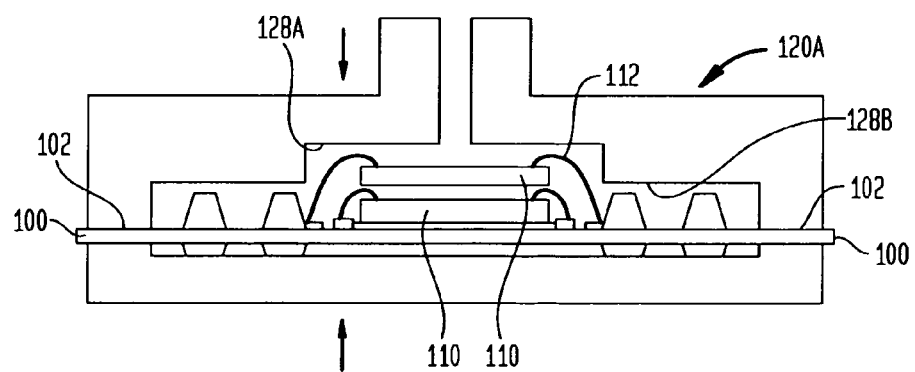
FIG. 9 is a sectional view illustrating a molding stage in a method of fabricating a microelectronic package in accordance with a variation of the embodiment shown in FIG. 3.

The encapsulant 130 also includes a peripheral region 151 that extends from the central region 147 towards peripheral edges 156 of the substrate 100. The major surface 152 of the encapsulant in the peripheral region 151 has a height 154 that is less than height 150 of the encapsulant in the central region. Typically, the heights of the major surfaces of the encapsulant in the central and peripheral regions 147, 151 are determined by the shape of the top plate 120A of a mold used to form the encapsulant, in a method similar to that shown in FIG. 3. Referring to FIG. 9, to form the central and peripheral regions of the encapsulant material having different heights, the inner surface 128A of the top plate 120A of the mold lies at a greater height from the substrate top surface 102 at locations above the microelectronic element 110 and the wire bonds 112 than inner surface 128B of the top plate 120A lies from the substrate top surface 102 above the conductive posts 106.

Alternatively, in one variation, the encapsulant layer can be formed with a major surface at a uniform height 150 in both the central and peripheral regions 147, 151, and then a saw or other means can be used to reduce the height of the encapsulant layer in the peripheral region to the lower height 154.

Figure 10:
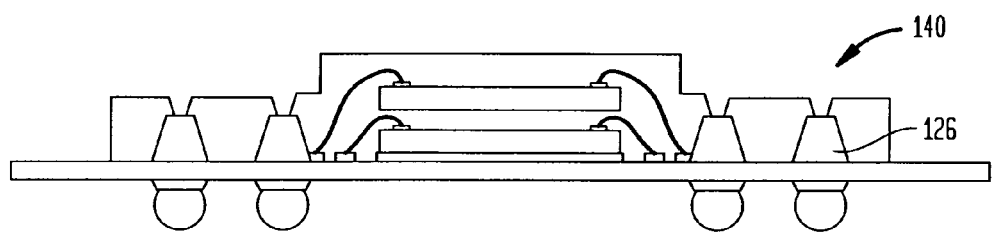
FIG. 10 is a sectional view illustrating a microelectronic package in accordance with a variation of the embodiment illustrated in FIG. 6.

FIG. 10 illustrates a variation of the microelectronic package shown in FIG. 8, in which the top surfaces of the conductive posts 106 are only partially exposed within openings 140 in the encapsulant material, similar to the embodiment described above with respect to FIG. 6.

Figure 11:
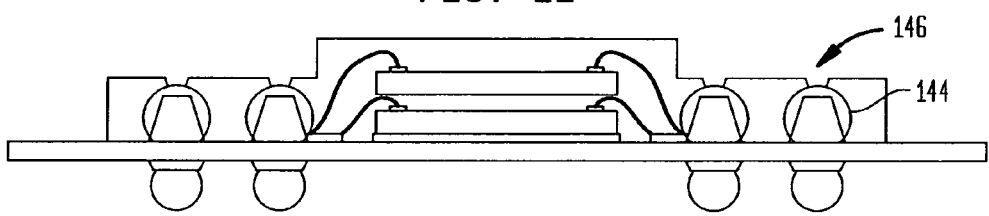
FIG. 11 is a sectional view illustrating a microelectronic package in accordance with a variation of the embodiment illustrated in FIG. 7.

FIG. 11 illustrates a variation of the microelectronic package shown in FIG. 8, in which surfaces of conductive masses 144 joined to conductive posts 106 are at least partially exposed within openings 140 in the encapsulant material, similar to the embodiment described above with respect to FIG. 7.

Figure 12:
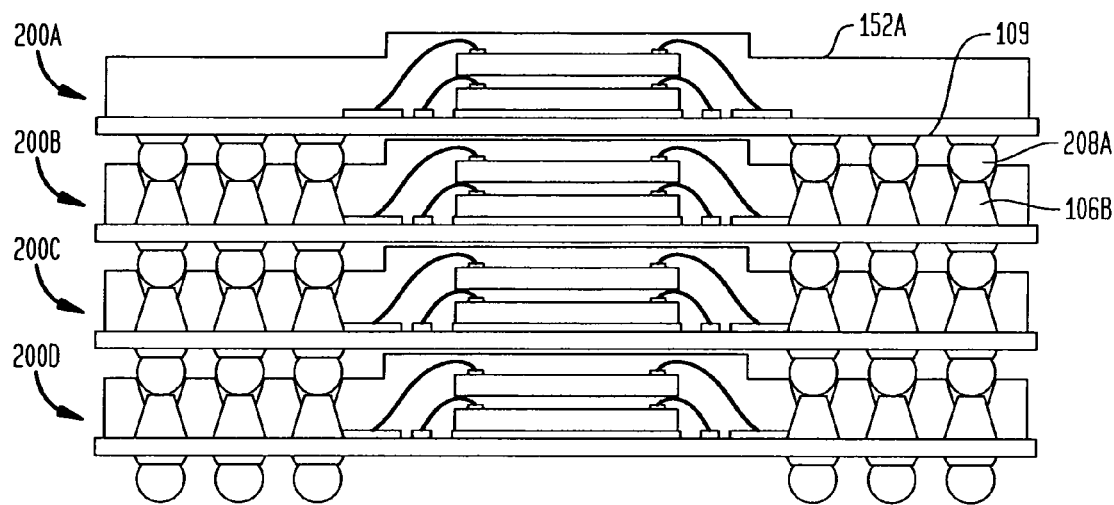
FIG. 12 is a sectional view illustrating a stacked microelectronic assembly in accordance with an embodiment of the invention.

FIG. 12 shows the microelectronic package of FIG. 8 stacked on top of other microelectronic packages. Specifically, a first microelectronic package 200A is stacked atop a second microelectronic package 200B, which in turn is stacked atop a third microelectronic package 200C. The third microelectronic package, in turn, is stacked atop a fourth microelectronic package 200D. The four microelectronic packages are preferably electrically interconnected with one another. Conductive masses 208A, e.g., solder balls, of the first microelectronic package 200A are in contact with the conductive posts 106B of the second microelectronic package 200B. During assembly, the conductive masses 208A can be elevated in temperature so as to at least partially transform into a molten state so that the conductive posts 106B can be at least partially inserted therein and are joined to one another thereby. The temperature of the conductive masses 208A then may be lowered so that the conductive masses re-solidify for permanently connecting the substrate 200A with the substrate 200B through the conductive posts 106B and the conductive masses 208A. The electrical connections between the second microelectronic package 200B and the third microelectronic package 200C are made in a similar fashion, as are the electrical interconnections between the third microelectronic package 200C and the fourth microelectronic package 200D. Typically, joining of the microelectronic packages to form the electrical connections in the assembly is done simultaneously as to all packages therein. However, it can be done as to only a subset of the packages, and then further joining processes then applied to join additional packages or one or more subsets of packages thereto. Although FIG. 12 shows an assembly including four microelectronic packages stacked one atop the other, the present invention contemplates that any size assembly of two or more microelectronic packages may be manufactured. For example, in one embodiment, a stack of five or more microelectronic packages may be possible. The uppermost or lowermost package in the stack may be electrically connected to an external element such as a circuit board or a test board, i.e., through solder balls, other conductive masses or posts, etc. Optionally, as seen in FIG. 12, the uppermost microelectronic package 200A in the assembly can be made without conductive elements such as conductive posts, conductive masses, etc. being exposed at a top surface 152A of such package 200A. Before the individual microelectronic packages are assembled together in a stack, each package can be individually tested.

Figure 13:
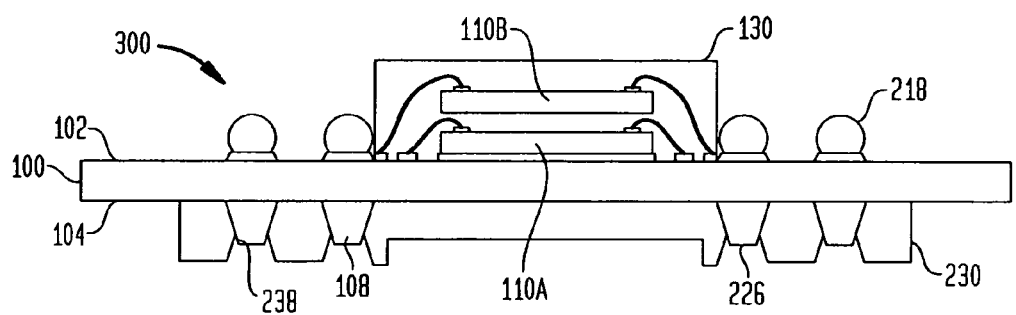
FIG. 13 is a sectional view illustrating a microelectronic package in accordance with a variation of the embodiment illustrated in FIG. 8.

FIG. 13 shows a microelectronic package in accordance with a variation of the embodiment shown in FIG. 8. In this case, conductive masses, e.g., solder balls 218 are exposed at a top surface 102 of the package. An encapsulant layer 130 overlies a face of a microelectronic element or plurality of microelectronic elements 110A, 110B.

An additional encapsulant layer 230 overlies a bottom surface 104 of the substrate 100, having openings 240 which expose top surfaces 226 of conductive posts 108 which project away from the bottom surface 104 of the substrate 100. Similar to the openings 136 in the encapsulant layer 130 of the above-described embodiment (FIG. 5), the openings 240 can expose the top surfaces 226 of the conductive posts and partially expose the edge surfaces 238 of the conductive posts. Optionally, conductive masses e.g., solder masses, tin, conductive paste, among others, can be joined with surfaces of the conductive posts 108. The microelectronic package 300 illustrated in FIG. 13 can be stacked and joined with one or more other microelectronic packages in a manner similar to that described above with respect to FIG. 12.

In a variation of the embodiment illustrated in FIG. 13, the conductive masses 218 can be replaced by conductive posts, such as described above. In another variation, the top surfaces 226 of the conductive posts 108 can be only partially exposed within the openings 240, similar to the arrangement of the conductive posts 106 and openings 140 shown and described above with respect to FIG. 6. In yet another variation, surfaces including top surfaces 226 and edge surfaces 238 of the second conductive posts 108 can be joined with conductive masses prior to placing the assembly into the mold, similar to the arrangement shown and described above with respect to FIG. 7. In such case, the openings 240 at least partially expose the conductive masses joined with the second conductive posts, similar to the arrangement shown in FIG. 8 in which conductive masses 144 are partially exposed within openings 146. Each of these variations can be combined with features shown and described above with respect to any of the foregoing figures. Although the present invention is not limited by any particular theory of operation, it is believed that the planarization of the conductive masses will enable the mass production on a plurality of microelectronic packages, each package having a standard height. The structure shown in any of FIGS. 5, 5A, 5B, 6, 7, 8, 10, 11, and 13 may be stacked atop other microelectronic packages to form a stacked assembly, similar to the stacked assembly shown in FIG. 12.

In another variation of the embodiments described above, a contact-bearing face 113 (FIG. 1A) of the microelectronic element 110 can be placed adjacent the top surface 102 of the substrate 100, and contacts 117 can be juxtaposed in a flip-chip manner with substrate contacts exposed at the top surface 102 of the substrate in alignment therewith, the contacts 117 of the microelectronic element being conductively bonded with contacts exposed at the top surface of the substrate. Such arrangement can be combined with any of the embodiments and variations thereof described in the foregoing. Moreover, in the embodiments shown and described above (FIGS. 5, 5A, 5B, 6, 7, 8, 10, 11, and 12), instead of conductive masses 108 projecting away from the substrate bottom surface, the microelectronic package can instead have conductive posts such as described above, or posts which can be combined with conductive masses thereon, e.g., masses of conductive bonding material such as tin, solder, conductive paste, etc., in their place. Further details of microelectronic packages to which the foregoing described embodiments can be applied include U.S. application Ser. No. 11/318,404 filed Dec. 23, 2005 (Tessera 3.0-484), the disclosure of which is incorporated by reference herein.

The foregoing descriptions of the preferred embodiments are intended to illustrate rather than to limit the present invention. Particular methods of fabricating microelectronic packages and structures therein can be as further described in commonly owned U.S. application Ser. No. 12/839,038 of Belgacem Haba titled "STACKABLE MOLDED MICROELECTRONIC PACKAGES WITH AREA ARRAY UNIT CONNECTORS" filed on even date herewith.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A microelectronic package comprising:
a substrate having a first surface and a second surface remote from the first surface;
a microelectronic element overlying the first surface;
substantially rigid conductive posts projecting above at least one of the first or second surfaces, the conductive posts having top surfaces remote from the substrate and edge surfaces extending away from the top surfaces;
conductive elements exposed at a surface of the substrate opposite the surface above which the conductive posts project, the conductive elements being electrically interconnected with the microelectronic element; and
an encapsulant overlying at least a portion of the microelectronic element and the surface of the substrate above which the conductive posts project, the encapsulant having a plurality of openings each exposing the top surface and partially exposing the edge surface of at least one of the conductive posts, wherein at least some of the conductive posts are electrically insulated from one another and adapted to simultaneously carry different electric potentials.

2. The microelectronic package as claimed in claim 1, wherein the conductive posts project to a first height above at least one of the first or second surfaces, the encapsulant contacts the conductive posts and has a major surface at a second height above the same surface of the substrate above which the conductive posts project, the second height being greater than the first height, wherein the openings in the encapsulant are openings in the major surface.

3. The microelectronic package as claimed in claim 2, wherein the conductive posts project above the first surface and the conductive elements are exposed at the second surface.

4. The microelectronic package as claimed in claim 3, wherein the first surface has a first region and a second region extending from the first region, the microelectronic element overlies the first region, and the posts are aligned with the second region.

5. The microelectronic package as claimed in claim 2, wherein the conductive posts project above the second surface and the conductive elements are exposed at the first surface.

6. The microelectronic package as claimed in claim 4, wherein the major surface of the encapsulant is a substantially planar surface, the encapsulant further having a second surface overlying the microelectronic element at a third height above the first surface, the third height being different from the second height.

7. The microelectronic package as claimed in claim 6, wherein the third height is greater than the second height.

8. The microelectronic package as claimed in claim 4, wherein the major surface of the encapsulant is a substantially planar surface overlying the first and second regions of the first surface at an at least substantially uniform second height therefrom and overlying the microelectronic element.

9. The microelectronic package as claimed in claim 2, wherein at least one conductive post includes a tip region remote from the microelectronic element and a second region disposed below the tip region and closer to the substrate, the second region and tip region having respective concave circumferential surfaces, and the at least one post consisting essentially of metal and having a horizontal dimension which is a first function of vertical location in the tip region and which is a second function of vertical location in the second region.

10. The microelectronic package as claimed in claim 3, wherein the conductive elements include at least one of conductive posts or masses of conductive bonding material, and a portion of the encapsulant overlies the second surface and further has a plurality of second openings, each partially exposing at least one of the conductive elements, wherein at least some of the conductive elements are electrically insulated from one another and adapted to simultaneously carry different electric potentials.

11. The microelectronic package as claimed in claim 2, wherein surfaces of at least two of the conductive posts are at least partially exposed within a single one of the openings.

12. A microelectronic package comprising:
a substrate having a first surface and a second surface remote from the first surface;
a microelectronic element overlying the first surface;
substantially rigid conductive posts projecting above at least one of the first or second surfaces, the conductive posts having top surfaces remote from the substrate and edge surfaces extending away from the top surfaces;
conductive masses joined to the conductive posts;
conductive elements exposed at a surface of the substrate opposite the surface above which the conductive posts project, the conductive elements being electrically interconnected with the microelectronic element; and
an encapsulant overlying at least a portion of the microelectronic element and the surface of the substrate above which the conductive posts project, the encapsulant having a plurality of openings each partially exposing at least one of the conductive masses joined to the conductive posts, wherein at least some of the conductive masses are electrically insulated from one another and adapted to simultaneously carry different electric potentials, wherein the conductive masses project to a first height above at least one of the first or second surfaces, the encapsulant contacts the conductive masses and has a major surface at a second height above the same surface of the substrate above which the conductive masses project, the second height being greater than the first height, wherein the openings in the encapsulant are openings in the major surface, wherein surfaces of at least two of the conductive masses are at least partially exposed within a single one of the openings.

13. A microelectronic package comprising:

a substrate having a first surface and a second surface remote from the first surface;

a microelectronic element overlying the first surface;

substantially rigid conductive posts projecting above at least one of the first or second surfaces, the conductive posts having top surfaces remote from the substrate and edge surfaces extending away from the top surfaces;

conductive elements exposed at a surface of the substrate opposite the surface above which the conductive posts project, the conductive elements being electrically interconnected with the microelectronic element; and an encapsulant overlying at least a portion of the microelectronic element and the surface of the substrate above which the conductive posts project, the encapsulant having a plurality of openings each partially exposing the top surface of at least one of the conductive posts, wherein at least some of the conductive posts are electrically insulated from one another and adapted to simultaneously carry different electric potentials, wherein the conductive posts project to a first height above at least one of the first or second surfaces, the encapsulant contacts the conductive posts and has a major surface at a second height above the same surface of the substrate above which the conductive posts project, the second height being greater than the first height, wherein the openings in the encapsulant are openings in the major surface, wherein at least one conductive post includes a tip region remote from the microelectronic element and a second region disposed below the tip region and closer to the substrate, the second region and tip region having respective concave circumferential surfaces, and the at least one post consisting essentially of metal and having a horizontal dimension which is a first function of vertical location in the tip region and which is a second function of vertical location in the second region.

14. A microelectronic package comprising:

a substrate having a first surface and a second surface remote from the first surface;

a microelectronic element overlying the first surface;

substantially rigid conductive posts projecting above at least one of the first or second surfaces, the conductive posts having top surfaces remote from the substrate and edge surfaces extending away from the top surfaces;

conductive masses joined to the conductive posts;

conductive elements exposed at a surface of the substrate opposite the surface above which the conductive posts project, the conductive elements being electrically interconnected with the microelectronic element; and an encapsulant overlying at least a portion of the microelectronic element and the surface of the substrate above which the conductive posts project, the encapsulant having a plurality of openings each partially exposing at least one of the conductive masses joined to the conductive posts, wherein at least some of the conductive masses are electrically insulated from one another and adapted to simultaneously carry different electric potentials, wherein the conductive masses project to a first height above at least one of the first or second surfaces, the encapsulant contacts the conductive masses and has a major surface at a second height above the same surface of the substrate above which the conductive masses project, the second height being greater than the first height, wherein the openings in the encapsulant are openings in the major surface, wherein at least one conductive post includes a tip region remote from the microelectronic element and a second region disposed below the tip region and closer to the substrate, the second region and tip region having respective concave circumferential surfaces, and the at least one post consisting essentially of metal and having a horizontal dimension which is a first function of vertical location in the tip region and which is a second function of vertical location in the second region.

15. A microelectronic package comprising:

a substrate having a first surface and a second surface remote from the first surface;

a microelectronic element overlying the first surface;

substantially rigid conductive posts projecting above at least one of the first or second surfaces, the conductive posts having top surfaces remote from the substrate and edge surfaces extending away from the top surfaces;

conductive elements exposed at a surface of the substrate opposite the surface above which the conductive posts project, the conductive elements being electrically interconnected with the microelectronic element; and an encapsulant overlying at least a portion of the microelectronic element and the surface of the substrate above which the conductive posts project, the encapsulant having a plurality of openings each partially exposing the top surface of at least one of the conductive posts, wherein at least some of the conductive posts are electrically insulated from one another and adapted to simultaneously carry different electric potentials, wherein the conductive posts project to a first height above at least one of the first or second surfaces, the encapsulant contacts the conductive posts and has a major surface at a second height above the same surface of the substrate above which the conductive posts project, the second height being greater than the first height, wherein the openings in the encapsulant are openings in the major surface, wherein surfaces of at least two of the conductive posts are at least partially exposed within a single one of the openings.

* * * * *